United States Patent [19]

Barkley et al.

[11] Patent Number: 4,626,205
[45] Date of Patent: Dec. 2, 1986

[54] NOZZLE STRUCTURE FOR AIR FLOW SOLDERING/DESOLDERING

[75] Inventors: Vincent P. Barkley, Arlington, Va.; William J. Siegel, Silver Spring, Md.

[73] Assignee: Pace, Incorporated, Laurel, Md.

[21] Appl. No.: 763,705

[22] Filed: Aug. 8, 1985

[51] Int. Cl.$^4$ ............................. F24J 3/00; B23K 1/00
[52] U.S. Cl. ..................................... 432/225; 53/440; 219/273; 228/20; 432/231
[58] Field of Search ................. 432/225, 226, 231; 53/440, 442; 219/273; 228/19, 20

[56] References Cited

U.S. PATENT DOCUMENTS

| | | | |
|---|---|---|---|
| 3,524,247 | 8/1970 | Goldschmied | 219/373 |
| 4,366,925 | 1/1983 | Fanene | 156/584 |
| 4,436,242 | 3/1984 | Shisler et al. | 228/19 |
| 4,444,559 | 4/1984 | Schink et al. | 432/226 |
| 4,552,300 | 11/1985 | Zovko | 219/373 |

Primary Examiner—John J. Camby
Attorney, Agent, or Firm—Gerald J. Ferguson, Jr.; Michael P. Hoffman; James E. Bryan

[57] ABSTRACT

Nozzle structure suitable for bringing heated fluid into contact with a plurality of terminals of a modular electronic component to facilitate attachment of the component to a substrate or removal therefrom. The nozzle structure comprises a conduit forming member engageable with the component and with the substrate to form a heated fluid conduit extending around the periphery of the component, and a heated fluid delivery conduit coupled to the conduit forming member for delivering heated fluid to the heated fluid conduit to effect melting of solder or the like at the terminals of the component.

19 Claims, 11 Drawing Figures

NOZZLE STRUCTURE FOR AIR FLOW SOLDERING/DESOLDERING

The present invention relates to nozzles, and in particular to improved nozzle structures suitable for bringing heated fluid into contact with the terminals of modular components to facilitate attachment of the components to a substrate or removal therefrom.

BACKGROUND OF THE INVENTION

Devices for attaching modular electronic components to or removing them from a substrate, such as a printed circuit board, are well known. Present day devices for removing or installing modular eletronic components from a substrate such as a printed circuit board generally fall into two categories, namely those which use a heated head which contacts each terminal to melt the solder thereon, or those which use a blast of hot air to melt the solder. In the latter devices, the blast of hot air is directed towards the terminals from a source above the components to simultaneously melt the solder on each of the terminals. An example of such a device is set forth in U.S. Pat. No. 4,366,925. Such a device may function satisfactorily if there is a large spacing between the components on the printed circuit board, such that the blast of hot air directed at one component from above will not flow over and melt the solder on the terminals of adjacent components. However, as the printed circuit board art advances, not only are the components themselves becoming increasingly smaller, but their proximity on the printed circuit board is also increasing. Thus, there is a need for a device which not only can provide a closely controlled and evenly distributed source of heat effective to melt the solder associated with the component terminals or printed substrate conductors during installation or removal of the electronic component relative thereto, but also one which can rapidly and precisely direct this controlled heat where desired, thereby minimizing the likelihood of melting the solder on the terminals of adjacent components or otherwise damaging the printed conductors on the substrate.

It is therefore a primary object of the present invention to provide a superior device for insulation and removal of electronic components from circuits printed on a substrate.

It is another object of the present invention to provide an improved nozzle structure for bringing heated fluid more directly into contact with the terminals of modular electronic components to facilitate their attachment or removal from a substrate.

It is a further object of the present invention to provide an improved nozzle structure having means for forming a conduit extending around the edge of the component for accurately directing heated fluid around the edge of the component to effect melting of the solder at the terminals of the component.

It is yet another object of the present invention to provide an improved nozzle structure in which the means for forming the conduit extending around the edge of the components is fabricated from a flexible material to facilitate sealing of the conduit forming means against the component and the substrate.

BRIEF DESCRIPTION OF THE INVENTION

According to one aspect of the present invention, there is provided a nozzle structure suitable for bringing heated fluid into contact with a plurality of terminals of a modular electronic component to facilitate attachment of the component to a substrate or removal therefrom. The nozzle structure comprises a conduit forming means engageable with the component and with the substrate to form a heated fluid conduit extending around the component. A heated fluid delivery means is coupled to the conduit forming means for delivering heated fluid to the conduit to thereby effect melting of solder or the like at the terminals of the component.

In a preferred embodiment, the conduit forming means comprises a frame having a top plate and side members attached to the top plate. The top plate is engageable with an external surface of the component, and the side members are engageable with the substrate to form the heated fluid conduit.

In another preferred embodiment, the conduit forming means includes a flexible sealing member having a first end engageable with the component and a second end engageable with the substrate to form the heated fluid conduit.

BRIEF DESCRIPTION OF THE DRAWINGS

The invention of the present application will now be described in more detail with reference to preferred embodiments, given only by way of example, and with reference to the accompanying drawings, in which.

DETAILED DESCRIPTION OF THE INVENTION

The present invention describes alternative nozzle structures which may be used in the inventions described and claimed in co-pending patent application Ser. No. 649,065 filed Sept. 10, 1984, co-pending patent application Ser. No. 742,702, filed June 7, 1985, and an application executed by William J. Siegel and Vincent P. Barkley on Aug. 2, 1985 entitled "HEATER DEVICE" U.S. patent application Ser. No. 762,869 filed Aug. 6, 1986. These applications relate to devices for attaching modular electronic components to or removing them from a substrate, and in view of the fact that the nozzle structure of the present invention may be utilized in those devices, the entire disclosures of those three applications are hereby specifically incorporated by reference into the present application.

In the following description, reference may be made to air as the fluid being heated. However, it will be appreciated that the invention is not limited to the use of air, and other fluids such as inert gases, including nitrogen, oxygen and carbon dioxide, may be used, if desired.

Figure 1:
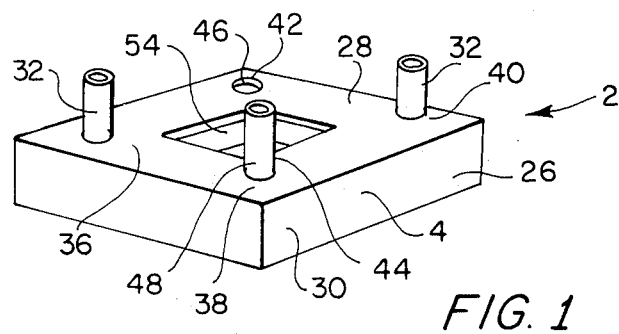
FIG. 1 is a perspective view of a nozzle structure of the invention.
Figure 2:
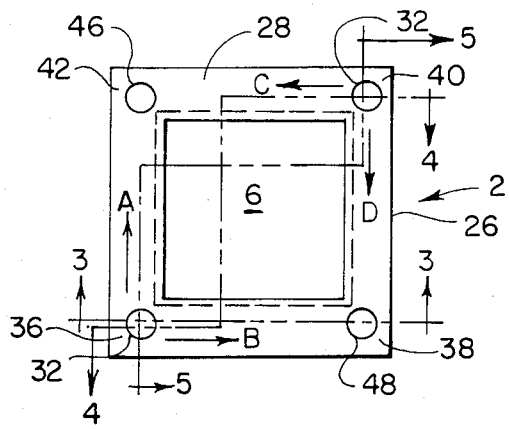
FIG. 2 is a plan view of the nozzle structure of FIG. 1.
Figure 3:
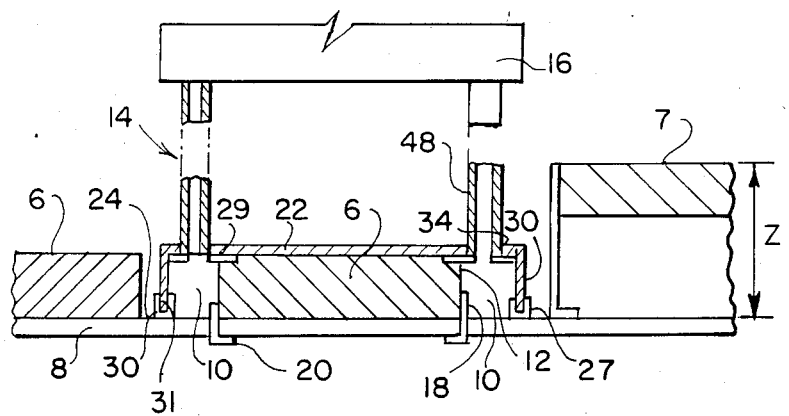
FIG. 3 is a cross-sectional side elevation taken along the line 3—3 of FIG. 2 showing the nozzle structure in position over a component.

Referring now to the drawings, and in particular to FIGS. 1 through 3, there is shown a nozzle structure, generally referenced 2, having a conduit forming means 4 engageable with a component 6, and with a substrate 8 to form a heated fluid conduit 10 extending around the periphery 12 of the component 6. The nozzle structure 2 also includes a heated fluid delivery means 14 for delivering heated fluid from a source of heated fluid 16 into the heated fluid conduit 10 for effecting melting of solder, or the like, 18 at the terminals 20 of the component 6.

Conduit forming means 4 is engageable with an upper surface 22 of the component 6, and/or with an upper surface 24 of the substrate to seal the conduit forming means 4 against the component 6 and the substrate 8 to form the heated fluid conduit 10 extending around the component 6. In the embodiment shown in FIGS. 1 through 3, conduit forming means 4 comprises a frame 26 including a top plate 28 and side members 30 attached to the top plate 28. As can be seen from FIG. 3, the top plate 28 is engageable with the upper surface 22 of the component 6 and the side members 30 are engageable with the upper surface 24 of the substrate to form the heated fluid conduit 10.

If the conduit forming means 4 does contact the upper surface 22 of the component 6 and/or the upper surface 24 of the substrate, it is desirable to provide a heat resistant compliant coating 27 on at least a lower surface 29 of the top plate 28 and at a lower edge 31 of side member 30 to render the conduit forming means 4 more conformable with the component and the substrate. Any suitable heat resistant compliant material may be used, for example teflon or silicon. Alternatively, the conduit forming means 4 may be designed so that it does not contact the upper surface 22 and/or the upper surface 24, so that a small gap (not shown) is provided between the conduit forming means 4 and the upper surface 22 of the component 6 and/or the upper surface 24 of the substrate 8. In this way, heated fluid may flow through the conduit 10 and out through these gaps.

The heated fluid delivery means 14 comprises at least one heated fluid delivery conduit 32 which is connected to the frame 26 at a location 34 such that when the frame 26 is engaged with the component 6 to form the heated fluid conduit 10, heated fluid is delivered adjacent the component 6 into the heated fluid conduit 10 so as to effect melting of solder 18 of the terminals 20. In the embodiment shown in FIG. 1, the top plate 28 has four corner areas 36, 38, 40 and 42, and two delivery conduits 32 are connected to the top plate 28 at alternate corner areas 36, 40. The other alternate corner areas 38, 42 have fluid exit means 44 which may be an aperture 46 or a tubular member 48 to permit exiting of heated fluid from the conduit 10.

The direction of flow of heated fluid in the embodiment of FIG. 1 is illustrated by the arrows A, B, C and D in FIG. 2 which shows heated fluid entering through delivery conduit 32 and for dividing into two separate flows A, B, C and D respectively through the conduit 10 along the recpective sides of the component 6.

The source of heated fluid 16 may be any suitable source of heated fluid, for example a device for producing heated air. As indicated earlier, the heating devices described and claimed in U.S. patent application Ser. Nos. 649,065 filed Sept. 10, 1984, 742,702 filed June 7, 1985 and the application entitled "Heater Device" executed by William J. Siegel and Vincent P. Barkley on Aug. 2, 1985 (all incorporated by reference) may be used with the nozzle structure of the present invention. In light of this, no further discussion is provided with respect to the nature of the source of heated fluid 16.

Figure 4:
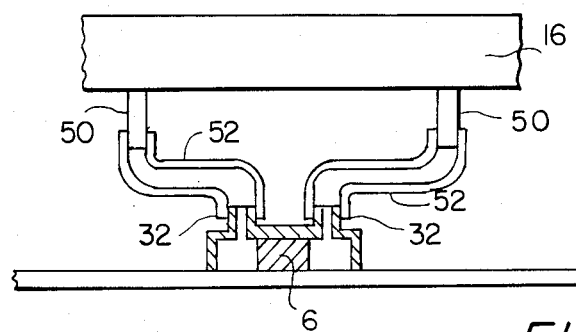
FIG. 4 is a cross-sectional side elevation taken along the line 4—4 in FIG. 2 showing a heated fluid delivery arrangement from a single heated fluid source to a small nozzle structure.

FIG. 4 shows how the nozzle structure of the present invention may be connected to a source of heated fluid 16, when the separation between the delivery conduits 32 is less than the separation between the exit means 50 of the source 16. A flexible connecting tube 52 may be employed to connect the exit means 50 and the delivery conduit 32. However, it will be appreciated any appropriate connection means may be used to effect this connection.

Figure 5:
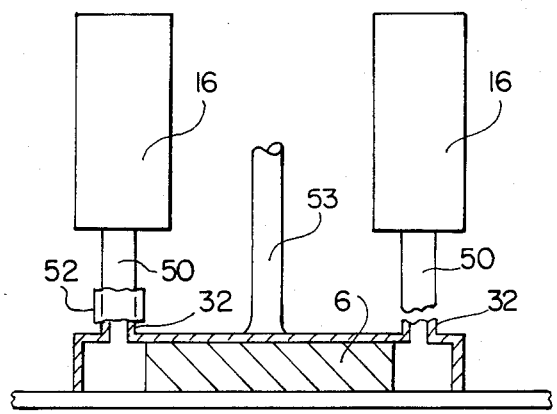
FIG. 5 is a cross-sectional view taken along the line 5—5 in FIG. 2 showing an embodiment utilizing two separate heated fluid sources.

FIG. 5 shows an alternative configuration wherein two heat sources 16 are employed. An advantage arising from this configuration is that the user's observation of the component 6 is not obscured by the heat source 16, which can occur in the arrangement shown in FIG. 4. It will also be noted that the nozzle structure may be provided with an aperture 54 in order to facilitate centering of the structure over the component, as well as the accommodation of other pieces of apertures, e.g. a source of vacuum 53.

Flexible sealing member 56 has a first end 58 and a second end 60, with the first end 58 being engageable with the component 6 and the second end being engageable with the substrate 8. A flexible sealing member 56 is provided with an anchor means 52, and this is preferably integrally molded with the remainder of the flexible sealing member as shown in FIG. 7. A clamping means 64 is provided for clamping the anchor means 62 to hold the flexible sealing member in the frame 66, and the clamping means preferably includes a master plate 68 and a holding plate 70 which are adjustably spaced with respect to each other by means of an adjustment means 72 which may be a bolt 74 threadably received in a tapped hole 76 as shown in FIG. 7. The master plate 68 and holding plate 70 define a clamping space 78 therebetween, and this receives and clamps the anchor means 62 of the flexible sealing member 56. As can be seen from FIG. 7, the anchor means 62 is a lug 80 spaced from the first end 58 so that the master plate 68 can be accommodated between the first end 58 and the lug 80. The lug 80 is clamped tightly between the master plate 68 and the holding plate 70 by tightening the bolt 74. Even tension can be applied to the flexible sealing member 56 by carefully tightening the bolts 74 spaced equally around the nozzle structure, shown in FIG. 6.

Figure 6:
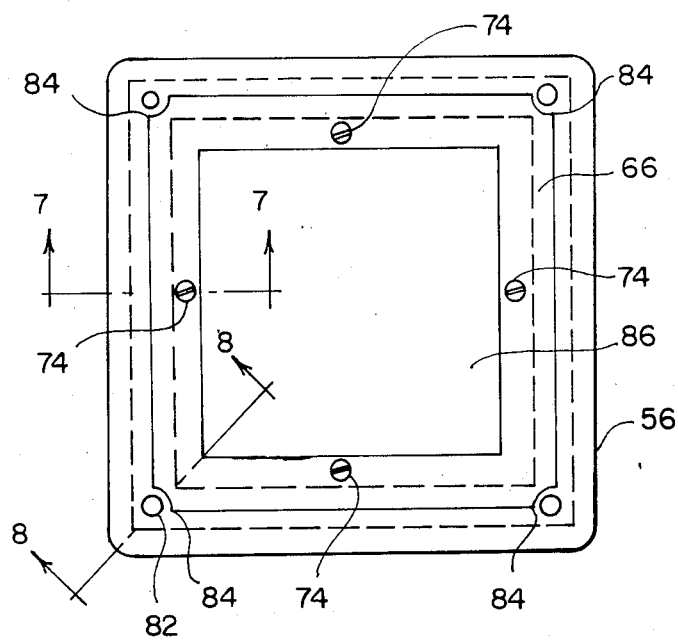
FIG. 6 is a plan view of an alternative nozzle structure of the invention incorporating a flexible sealing member.
Figure 7:
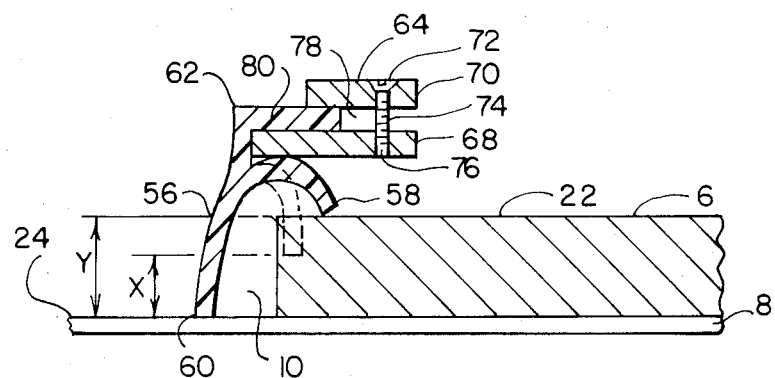
FIG. 7 is a cross-sectional side elevation taken along the line 7—7 in FIG. 6.
Figure 8:
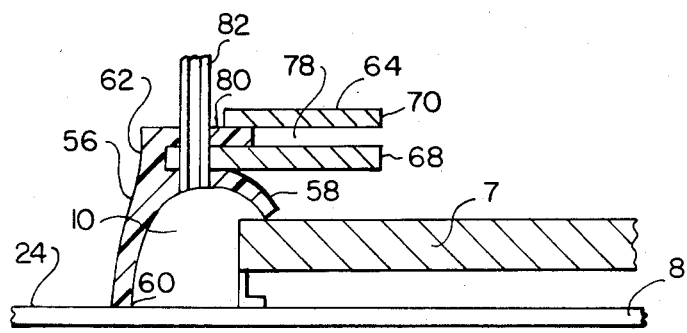
FIG. 8 is a cross-sectional side elevation taken along the line 8—8 in FIG. 6.

FIG. 8 shows, in cross-section a view taken along the line 8—8 shown in FIG. 6. As can be seen, a delivery conduit 82 is connected through the lug 80 and the first end 58 to provide access for heated fluid into the conduit 10. In order to accommodate delivery conduit 82, corner sections 84 are cut away from the holding plate 70 as shown in FIG. 6.

It will be appreciated that the nozzle structure of the present invention may be used for heating any type of terminals associated with modular electronic components. Thus, for example, FIG. 7 shows the nozzle structure in engagement with a leadless oomponent 6, and FIG. 8 shows the nozzle structure in engagement with a leaded component 7.

Figure 9:
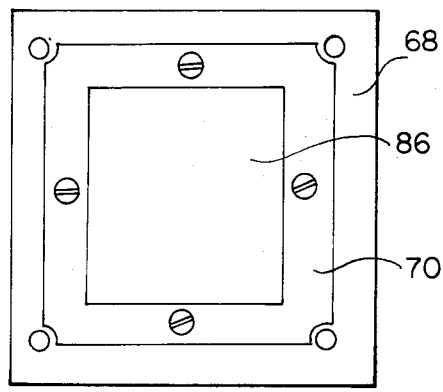
FIG. 9 is a plan view of the nozzle structure shown in FIG. 6 with the flexible sealing member removed.

FIG. 9 shows the master plate 68 and holding plate 70 as they appear in plan view when the flexible sealing member 56 is removed. In order to facilitate observation by the user of the component being removed or installed, and also to aid in centralizing the nozzle structure over the component, an aperture 86 is provided as shown in FIG. 9.

Referring again to FIG. 7, there is shown in dotted outline the configuration of the flexible sealing member 56 in an unflexed configuration, i.e when the end 58 is not in engagement with a component 6. In the unflexed configuration, the end 58 is disposed a distance X above the second end 60, whereas in the flexed condition, the first end 58 is disposed a distance Y above the second end 60. From this, it will be appreciated that the flexible sealing member 56 should be capable of undergoing flexing to accommodate components of different thicknesses and components which are mounted at different heights on the substrate. In order to achieve a satisfactory seal between the component and the substrate, the flexible sealing member 56 should be flexed at least so that the end 58 is at a distance which is greater than X shown in FIG. 7. If the distance X is greater than the thickness of the component, then it is necessary to deform the entire flexible sealing member 56 downwards, which may give rise to an incomplete seal around the component. In the arrangement shown in FIG. 7, the end 58 comes into contact with the upper surface 22 of the component 6 before the second end 60 contacts the upper surface 24 of the substrate, and this ensures the formation of a good seal between the flexible sealing device and the component around the entire periphery of the component. Generally, the thinnest components are leadless components 6, such as that shown in FIG. 7, and the thickest components are leaded components 7, such as that shown in FIG. 8.

Figure 10:
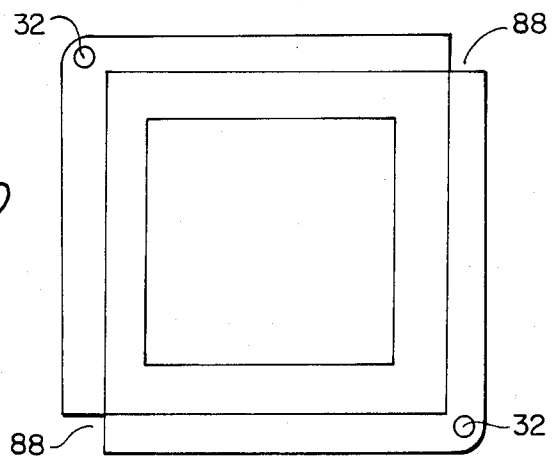
FIGS. 10 and 11 are further alternate embodiments of the nozzle structure of the invention.
Figure 11:
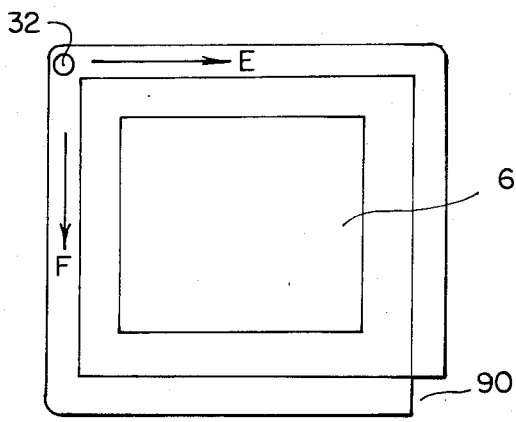

FIG. 10 shows a further embodiment, which eliminates exit conduits at the corners 88 not occupied by the delivery conduit 32. This arrangement comprising two diametrically opposed delivery conduit 32 is generally utilized with larger components where more heated fluid is required for melting of the solder at the terminals. However, with smaller components where the same amount of heated fluid is not required, it may be possible to eliminate one of the delivery conduits 32, such as in the embodiment shown in FIG. 11. In this embodiment, heated air enters the delivery conduit 32 and travels in the direction of the arrows E and F around the periphery of the component 6 and exits in the opposite corner 90.

The conduit 32 should be long enough to permit access of the nozzle structure between components without physically interfering with adjacent components. Thus, as can be seen in FIG. 3, it is clear that the delivery conduit 32 should be at least as long as the distance Z in order to enable the nozzle structure to be placed on the surface of the substrate without interfering with the component 7.

In order to improve the rigidity of the nozzle structure 2 when attached to the heated fluid source 16, the upstanding tubular members 48 may be attached to the heated fluid source to serve as support means for the nozzle structure. This is illustrated with dotted lines in FIG. 3.

From the above, it will be appreciated that the nozzle structure of the present invention enjoys certain advantages over the nozzle structures described and claimed in the applications referred to earlier and incorporated into the present application. In particular, the delivery conduits 32 facilitate direct delivery of heated fluid from the source of heated fluid to the area around the terminals of the component, without heated air being wasted in occupying the space above the component and away from the terminals. Thus, the nozzle structures of the present invention are more efficient, result in quicker melting of solder at the terminals, and therefore are more convenient and less costly to operate.

We claim:

1. A nozzle structure suitable for bringing heated fluid into contact with a plurality of terminals of a modular electronic component to facilitate attachment of said component to a substrate or removal therefrom, said nozzle structure comprising:
   conduit forming means adapted to contact a component and the substrate to form a heated fluid conduit extending around said component; and
   heated fluid delivery means coupled to said conduit forming means for delivering heated fluid to said conduit to effect melting of solder or the like at terminals of said component.

2. A nozzle structure according to claim 1, wherein said conduit forming means is adapted to contact an upper surface of said component and an upper surface of said substrate to form said heated fluid conduit extending around said component.

3. A nozzle structure according to claim 1, wherein said conduit forming means comprises a frame including a top plate and side members attached to said top plate, said top plate being adapted to contact an external surface of said component, and said side members being adapted to contact said substrate to form said heated fluid conduit.

4. A nozzle structure according to claim 1, wherein said delivery means comprises at least one heated fluid delivery conduit connected to said conduit forming means at a location such that when said conduit forming means is in contact with said component to form said heated fluid conduit, said heated fluid is delivered to said heated fluid conduit via said delivery conduit.

5. A nozzle structure according to claim 3, wherein said delivery means comprises at least one heated fluid delivery conduit connected to said frame for delivering heated fluid to said fluid conduit when said frame is in contact with said component.

6. A nozzle structure according to claim 5, wherein said top plate has four corner areas, and wherein two heated fluid delivery conduits are connected to said top plate at alternate corner areas.

7. A nozzle structure according to claim 6, wherein said frame includes heated fluid exit means for permitting heated fluid to exit said heated fluid conduit after passing through at least a portion of said heated fluid conduit.

8. A nozzle structure according to claim 1, wherein said conduit forming means includes a flexible sealing member having a first end adapted to contact said component and a second end adapted to contact said substrate.

9. A nozzle structure according to claim 8, wherein said flexible sealing member includes an anchor means for anchoring said sealing member to said conduit forming means.

10. A nozzle structure according to claim 9, wherein said conduit forming means includes clamping means for clamping said anchor means to firmly connect said flexible sealing member to said conduit forming means.

11. A nozzle structure according to claim 10, wherein said clamping means includes a master plate and a holding plate adjustably spaced-apart with respect to each other, said master plate and said holding plate defining therebetween a clamping space for receiving and clamping said anchor means between said master plate and said holding plate.

12. A nozzle structure according to claim 11 and including adjustment means for adjusting the spacing between said holding plate and said master plate, and for effecting clamping of said anchor means between said holding plate and said master plate.

13. A nozzle structure according to claim 8, wherein said first end of said flexible sealing member is disposed with respect to said second end such that said first end is flexed as said sealing member is engaged with said component followed by said second end contacting said substrate, to thereby sealingly engage said flexible sealing member against said component and said substrate to form said heated fluid conduit.

14. A nozzle structure according to claim 8, wherein said flexible sealing member is fabricated from a heat resistant flexible material.

15. A nozzle structure according to claim 14, wherein said heat resistant flexible material is silicone rubber.

16. A nozzle structure according to claim 8, wherein said delivery means comprises at least one heated fluid delivery conduit connected to said sealing member for delivering heated fluid to said heated fluid conduit when said flexible sealing member is engaged with said component and said substrate.

17. A nozzle structure according to claim 11, wherein at least said master plate has four corner areas, and wherein two heated fluid delivery conduits are connected to said master plate at alternate corner areas.

18. A nozzle strcuture according to claim 8, and further including heated fluid exit means for permitting heated fluid to exit said heated fluid conduit after passing through at least a portion of said heated fluid conduit.

19. A nozzle structure according to claim 11, and further including upstanding support means connected to said master plate for increasing rigidity of said nozzle structure when connected to a heat source.

* * * * *